United States Patent
Uzoh et al.

(10) Patent No.: US 6,372,081 B1
(45) Date of Patent: *Apr. 16, 2002

(54) PROCESS TO PREVENT COPPER CONTAMINATION OF SEMICONDUCTOR FABS

(75) Inventors: Cyprian E. Uzoh; L. Paivikki Buchwalter, both of Hopewell Junction, NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,572

(22) Filed: Jan. 5, 1999

(51) Int. Cl.[7] .................................. C23F 1/02
(52) U.S. Cl. .................. 156/345; 438/745; 438/753; 438/754
(58) Field of Search .................. 438/745, 754, 438/747, 693, 753; 216/75; 156/345; 204/265

(56) References Cited

U.S. PATENT DOCUMENTS

| | | | | |
|---|---|---|---|---|
| 4,165,252 A | | 8/1979 | Gibbs | 438/694 |
| 4,378,270 A | * | 3/1983 | Brasch | 216/93 |
| 4,482,425 A | * | 11/1984 | Battey | 216/90 |
| 4,545,850 A | * | 10/1985 | Nelson | 216/93 |
| 4,595,451 A | | 6/1986 | Holzer | 216/13 |
| 4,714,517 A | | 12/1987 | Malladi et al. | 216/34 |
| 5,213,622 A | | 5/1993 | Bohling et al. | 134/3 |
| 5,248,398 A | | 9/1993 | Cordani | 205/576 |
| 5,320,706 A | * | 6/1994 | Blackwell | 438/693 |
| 5,364,510 A | * | 11/1994 | Carpio | 134/2 |
| 5,605,602 A | | 2/1997 | DeBusk | 438/476 |
| 5,716,873 A | | 2/1998 | Prall et al. | 438/669 |
| 5,783,790 A | * | 7/1998 | Mitsumori et al. | 204/157.15 |
| 5,824,200 A | * | 10/1998 | Kitajima et al. | 204/265 |
| 5,865,984 A | * | 2/1999 | Corbin, Jr. et al. | 205/670 |

FOREIGN PATENT DOCUMENTS

DE          4117489          12/1992

* cited by examiner

Primary Examiner—Robert Kunemund
Assistant Examiner—Binh X. Tran
(74) Attorney, Agent, or Firm—Connolly Bove Lodge & Hutz, LLP; Joseph P. Abate, Esq.

(57) ABSTRACT

A process for removing material from a substrate. The material is exposed to an aqueous solution comprising about 4% to about 30% of at least one acid and at least one surfactant.

14 Claims, 1 Drawing Sheet

PROCESS TO PREVENT COPPER CONTAMINATION OF SEMICONDUCTOR FABS

FIELD OF THE INVENTION

The invention relates to a method, an apparatus, and a solution for the selective removal of metal or other materials from surfaces of a substrate after the substrate has been subjected to a metal or other material deposition operation. More particularly, the present invention relates to a method, apparatus and solution to remove metal from surfaces where the presence of such metal is undesirable. In doing so, the present invention helps to prevent contamination of elements of a processing line as the undesired material separates from the surfaces.

BACKGROUND OF THE INVENTION

In the production of microelectronic devices, packages, flat panels, among other articles, one or more metals, alloys, and/or materials may be deposited on surfaces for a variety of purposes. Typically, it is desirable for metal to be deposited only in certain locations and not in others. Metal deposited outside of desired locations may lead to defects in semiconductor devices. Also, metal or other materials absorbed, adsorbed, and/or deposited outside of desired locations may result in contamination of elements of a semiconductor device fabrication facility.

Furthermore, metal deposited on areas where it is not meant to be deposited may not adhere properly. For example, copper has poor adhesion to most insulators. As a result, the poorly adhered metal may easily be separated from the semiconductor substrate or package causing contamination to the semiconductor device fabrication line. Also, copper ions may adsorb on dielectric surfaces, and may be sheared or transferred to other surfaces during subsequent operations.

As a result of metal, such as copper, gold, silver, nickel, palladium and/or platinum deposited outside of desired areas, metal, for example copper, and/or other material, such as resin and/or resist residues, that is deposited, absorbed, and/or adsorbed on edges and/or backsides or other surfaces of a semiconductor wafer or other substrate where it is not desired that the metal be deposited may flake off of or otherwise be separated from the substrate. The flaked off materials and/or metal may act as a source of particulate that may then contaminate deposition equipment and/or other subsequent apparatus and equipment that is exposed to the semiconductor wafer or other substrate. Particulates or undesirable metal or other material contamination of devices may result in degraded chip and package yield, degraded performance, and expensive equipment or factory clean up operations. Also, expensive operating protocols may be necessary to minimize or reduce particulate and unwanted materials contamination problems.

An additional problem related to unwanted metal deposition is tool cross-contamination and line contamination. These problems may be caused by improperly deposited metal on a substrate randomly falling off to surfaces to where they are least desired to be. For example, metal and/or other material may flake off on surfaces on a robot handler. It may also be transferred by the shearing action, as the backside of a wafer to equipment and/or robot end effector.

Copper, like gold and other metals that form deep trapping centers in semiconductor devices are not generally welcomed in semiconductor lines. However, as the use of copper for chip interconnect wiring applications gains more acceptance, the potential for copper contamination and cross-contamination of equipment in semiconductor fabrication lines and contamination of entire fabrication lines is a concern that needs to be seriously addressed. Copper deposition by electroplating, electroless plating, or chemical vapor deposition (CVD) methods on wafers or substrates is known to leave copper residues on the backside of wafers. The backside copper residues may contaminate various wafer handlers and equipment in semiconductor fabrication lines. Copper decontamination of process equipment and/or the entire fabrication line typically is expensive.

SUMMARY OF THE INVENTION

The present invention addresses these and other problems by providing a process for removing material from a substrate. The material is exposed to an aqueous solution comprising about 4% to about 30% of at least one acid and at least one surfactant.

Also, the present invention provides a solution for removing metal from a substrate. The solution includes an aqueous solution of about 4% to about 30% of at least two acids. At least one surfactant is also included in the solution.

Furthermore, the present invention includes a system for removing metal from a substrate. The system includes a vessel for receiving the substrate and a solution for removing material from the substrate. The vessel includes at least one drain for draining the solution and at least one inlet for introducing the solution into the vessel. The system also includes an aqueous solution comprising about 4% about 30% of at least one acid and at least one surfactant. The system also includes a solution reservoir that includes at least one inlet and at least one drain. Connections permit solution to flow between the vessel and the solution reservoir. A pump pumps solution from the solution reservoir to the vessel. A cathode and an anode are arranged in the solution reservoir for removing from the solution material removed from the substrate. The system also includes a power source connected to the anode and the cathode.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
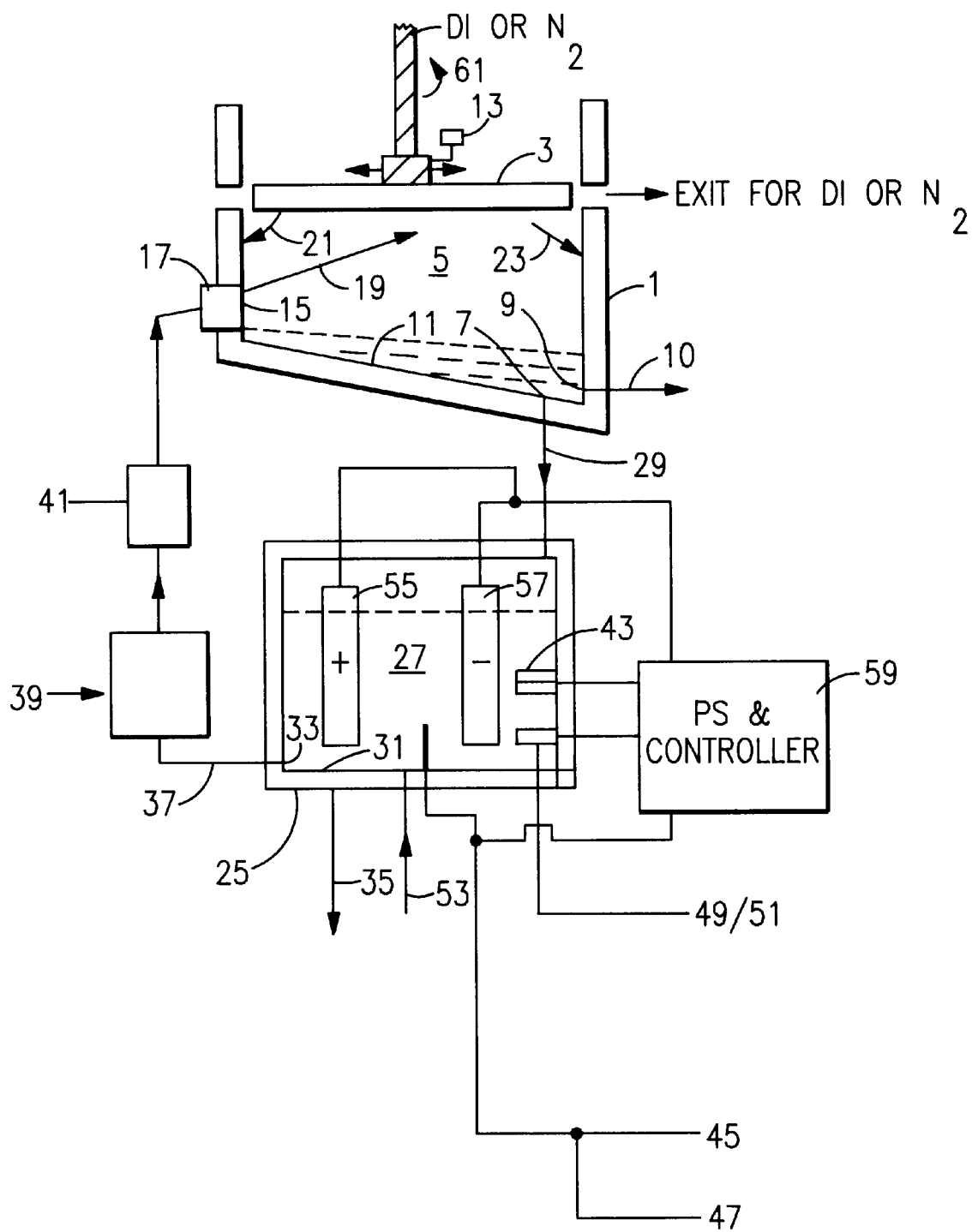
FIG. 1 represents a cross-sectional schematic view of an embodiment of a system for removing unwanted metal deposits according to the present invention.

As stated above, copper, gold, silver, nickel, palladium, platinum, and other metals utilized in semiconductor devices represent undesirable materials in semiconductor fabrication lines. Particularly with copper, as copper becomes more common for chip interconnect wiring applications, the potential for copper contamination and cross-contamination of equipment in semiconductor fabrication lines and contamination of entire semiconductor fabrication lines needs to be addressed. For example, copper deposition by electroplating, electroless plating, or CVD methods on wafers or other substrates is known to leave copper residues on the backside and/or other surfaces of wafers or other substrates. These residues, which can include deposits outside of desired locations, may contaminate wafer handlers and other equipment in semiconductor fabrication lines.

Copper and/or other metal decontamination of wafer handlers and other elements of the semiconductor fabrication lines is expensive and time consuming. For example, decontaminating elements of the fabrication line requires time and material to conduct the decontamination. However, time and material are also consumed in developing protocols for decontaminating the fabrication line.

The present invention provides a method, solution, and apparatus for removing undesirable metal deposits from wafers and other substrates to reduce the metal deposits remaining on the backside and/or other surfaces of the wafers and/or substrates after metal deposition. The present invention is particularly useful in removing and reducing as a source of contamination unwanted copper deposits on the backside of wafers and other substrates.

Often, after copper deposition processes, high copper levels may remain on the wafer and/or other substrate backside and/or other surfaces. The material on the backside and/or other surfaces may come from plating solutions and/or vapor deposition processes utilized to deposit the material on a wafer or other substrate. The material may also come from material deposited on wafer or substrate handlers, and other sources.

Often, the level of contamination can rise to greater than $1 \times 10^{12}$ atoms/cm$^2$. These metal deposits may be separated from the wafer or other substrate and contaminate handlers, such as robot handlers, furnaces, and other tools in the semiconductor fabrication line.

In the past, deionized water rinses have been utilized to try to reduce the level of copper on the backside and/or other surfaces of wafers or other substrates. However, deionized water rinses typically and inadequate to address this problem.

The present invention provides a solution to the above and other problems related to unwanted metal deposits on semiconductor substrates by providing a process for removing the deposits. The process includes exposing the unwanted deposits to an aqueous acidic solution that may include a complexing agent for complexing with material removed from the semiconductor substrate. In particular, a solution according to the present invention typically includes about 4% to about 30% of at least one acid. Some embodiments of a solution according to the present invention may be utilized in a process according to the present invention include at least two acids. However, any number of acids may be utilized in a solution according to the present invention.

The acid(s) may vary, depending upon the embodiment. For example, the solution according to the present invention can include at least one mineral acid, inorganic acid, or organic acid. Examples of organic acids are acetic acid and methyl sulfonic acid. The present invention may also or alternatively include at least one inorganic acid. According to some examples, a solution according to the present invention includes sulfuric acid or phosphoric acid. According to one particular example, a solution according to the present invention includes about 2% to about 15% acetic acid, about 2% to about 15% sulfuric acid, and/or about 2% to about 15% phosphoric acid.

Typically, the present invention includes dilute acid(s). Concentrated acids may be too aggressive and damage other structures of the semiconductor substrate.

A solution according to the present invention for utilization of a process according to the present invention may also include at least one complexing agent. The complexing agent typically forms a complex with material, such as copper or other metal(s), removed from the substrate. Those skilled in the art will be able to determine any suitable complexing agent or agents that may be utilized in the solution according to the present invention to complex with the material that is being removed from the substrate.

A solution according to the present invention may also include more than one complexing agent. According to one example, in which copper is being removed from a semiconductor substrate, the complexing agent includes ethylenediaminetetraacetic acid (EDTA) and/or a mineral salt solution. One example of a mineral salt is ammonium sulfate.

According to one embodiment, a solution according to the present invention the acid(s) may act as a complexing agent. For example, a solution that includes acetic acid may not need to include a complexing agent such as EDTA, since the acetic acid may act as the complexing agent, forming a complex with the copper.

A solution according to the present invention may include about 2% to about 20% complexing agent. The amount of complexing agent included in a solution according to the present invention may depend in at least in part upon the amount of material that it is desired the solution removed from a substrate.

A solution according to the present invention that may be utilized in a process according to the present invention may also include at least one surfactant. The present invention may also include more than one surfactant. However, any number of surfactants may be utilized in a solution according to the present invention.

The surfactant(s) may vary, depending upon the embodiment. For example, examples of a solution according to the present invention can include alkanol-ACN and/or FC-98, a surfactant available from 3M Corporation of Minnesota. The effect of the surfactant is to reduce the incidence of particulate redeposition on the substrate during the cleaning operations.

A solution according to the present invention may include about 50 ppm to about 1000 ppm surfactant(s). The amount of surfactant(s) included in a solution according to the present invention may depend in at least in part upon the need to prevent particulate redeposition on the surface of the substrate. Levels of surfactants may also depend upon the need to enhance the drying operations. Surfactant levels may also be controlled to at least partially passivate the surface of the metal film.

A solution according to the present invention may further include dissolved $O_2$ and/or dissolved $N_2$. Oxygen enrichment of the cleaning solution, such as sulfuric acid, may enhance the removal of, for example, unwanted copper metal or materials. The oxygen may oxidize copper metal, while the acid may dissolve copper oxides. The $N_2$ may be utilized to control the concentration of $O_2$ in the solution by displacing $O_2$. The $N_2$ may also enhance the cleaning action. A solution according to the present invention may include dissolved oxygen at a level of about 10 ppm to about 50 ppm and/or dissolved nitrogen at a level of about 5 ppm to about 100 ppm.

The acids(s), complexing agent(s), surfactant(s) and other elements of a solution according to the present invention may vary, depending upon the metal to be remove, the composition of the substrate and other materials and structures on the substrate, speed with which it is desired the solution remove the material, and/or percentage of material that it is desired the solution remove, among other factors.

As stated above, the present invention includes a process for removing material, typically metal(s) from a substrate, typically a semiconductor substrate. A process according to the present invention includes exposing material to be removed from a substrate to a solution such as that described above. The material may be exposed to the solution for a time of about 3 seconds to about 30 seconds. For example, the cleaning solution may be sprayed on the backside of a substrate at a flow rate of about 1 gpm to about 5 gpm. While the solution is directed at the substrate, the substrate may be rotated. If the substrate is rotated, it may be rotated at a rate of about 10 rpm to about 50 rpm. The time that the solution is directed toward a substrate and/or the time that the substrate is rotated may be sufficient to reduce copper or other material levels on the backside of the substrate to an acceptable level. Typically, an acceptable level is about $1 \times 10^{10}$ atoms per square centimeter.

A process according to the present invention may also include introducing oxygen in the form of $O_2$ and/or $N_2$ into the solution while exposing the material to the solution. Along these lines, oxygen may be introduced into the solution at a rate of about 50 sccm to about 750 sccm. Similarly, nitrogen may be introduced into the solution at a rate of about 50 sccm to about 750 sccm, To help ensure that the solution according to the present invention does not remove desired deposits on a front side of a semiconductor wafer, a process according to the present invention may include directing material at a side of the substrate opposite to the side where undesired deposits are to be removed. For example, if the undesired deposits are on the back and/or side surfaces of a semiconductor wafer, deionized could be directed at the top side of the semiconductor wafer. Deionized water directed toward the top side of the wafer may help to direct any deplating solution away from the top surface of the wafer. Other materials additionally to alternatively may be directed toward the surface or surfaces that it is not desired to remove metal deposits from.

A final rinse with deionized water or deionized water with surfactant, such as one or more of the surfactants discussed above, may be utilized to remove residue of the cleaning solution from the substrate. After the final rinse, the substrate may be dried. The drying may be carried out according to any known process. For example, the drying may be carried out mechanically, by spin rotation, or with nitrogen jets.

The deplating solution according to the present invention may be recirculated, recycled, and/or reused. Along these lines, a process according to the present invention may include recirculating, recycling and/or reusing the solution. To accomplish this, once material is removed from a semiconductor wafer or other substrate and enters the solution, the material may be removed from the solution.

According to one embodiment, the material may be electrochemically removed from the solution. To accomplish this, solution may be drained from a deplating vessel where the solution and the substrate including the unwanted deposits are arranged. Solution may be drained from the vessel into another container, such as a plating solution reservoir. Electrodes may be introduced into the plating solution and power supplied to the electrodes to electrochemically remove from the solution material removed from the substrate and dissolved in the solution or complexed with the complexing agent.

While in the solution reservoir, oxygen and/or nitrogen may be introduced into the solution. The oxygen and nitrogen may be introduced in the amounts and at the rates described above.

Also, the solution reservoir, deionized water may be introduced into the solution. Addition of deionized water to the solution may help to ensure that the composition of the solution remains constant or at a desired level. Along these lines, acid(s), complexing agent(s), and/or surfactant(s) could also be added to the solution. The composition of the solution could be varied during the treating if desired.

During its stay in the plating solution reservoir, the characteristics of the plating solution may be sensed by one or more sensors. For example, dissolved oxygen and/or nitrogen levels may be detected by an oxygen and/or nitrogen sensor. Also, levels of material being removed from the substrate may be detected. Along these lines, if copper is being removed from the substrate, the levels of copper build-up in the solution while it is in the reservoir may be detected. Furthermore, the levels of acid utilized in the solution according to the present invention may be detected. Detecting the makeup of the plating solution may help to ensure its effectiveness in removing material from substrates.

In addition to draining a portion of the plating solution from a deplating vessel for recirculation, recycling, and reuse, a portion of the deplating solution may be drained and disposed of. Also, at least a portion of the solution in the plating solution reservoir may be drained of and disposed of. Draining and disposing portions of the plating solution may help to ensure its consistency.

Solution that has been treated to remove material removed from the substrate may be recirculated back to the deplating vessel. This solution may be pumped with a pump from the reservoir back into the vessel. During passage of the plating solution from the reservoir back to the deplating vessel, the solution may be filtered.

As stated above, the present invention also includes a system for removing material from a substrate. This system includes a vessel for receiving the substrate and the solution. The material removal takes place in the vessel. The vessel includes at least one drain for draining the solution and at least one inlet for introducing the solution into the vessel. The system also includes solution as described above.

A system according to the present invention may also include a solution reservoir including at least one inlet and at least one drain. Connections permit solution to flow between the vessel and the solution reservoir. A pump may be included in the system for pumping the solution from the reservoir to the deplating vessel.

A cathode and an anode may be arranged in the solution reservoir for removing from the solution material removed from the substrate. A power source may be connected to the anode and the cathode.

FIG. 1 illustrates an example of an embodiment of a system according to the present invention. The system illustrated in FIG. 1 includes vessel 1 for holding the solution and receiving the substrate. The substrate may be supported in the vessel by a vacuum chuck arrangement, such as that illustrated in FIG. 1. The vessel 1 receives substrate 3 and contains solution 5.

As stated above, the vessel 1 includes at least one drain. If the vessel 1 includes a single drain, the single drain may serve as a connection between vessel 1 and the solution reservoir. The vessel illustrated in FIG. 1 includes two drains 7 and 9. First drain 7 may serve as a connection between the vessel and the solution reservoir permitting solution to flow between the vessel and the reservoir. Drain 9 may be utilized for disposing of solution. Solution drained through drain 9 may be disposed through conduit 10.

As illustrated in FIG. 1, vessel 1 may include a pitched bottom 11. The pitched bottom 11 may help to ensure flow of solution and materials precipitating out of the solution toward a drain from the vessel. For example, after complexing with material removed from the substrate, the complexing agent and material may precipitate out of the solution. Typically, the bottom of the vessel, if it is pitched, is pitched at an angle of about 5° to about 30° relative to the horizontal.

As stated above, deionized water or other material, such as a fluid that does not react with the substrate, may be directed toward the surface of the substrate 3 that material is not being removed from. FIG. 1 illustrates deionized water source 13 directed toward top surface of the substrate 3.

Vessel 1 also includes at least one inlet 15 for introducing solution 5 into vessel 1. Inlet 1 may include a nozzle for directionally introducing the solution into the vessel. For example, as illustrated in FIG. 1, inlet 1 may include a nozzle 17 for directing the fluid toward the substrate as indicated by arrow 19. Typically, directing the solution at the underside of the substrate results in flow of the solution along the substrate toward the sides of the vessel as indicated by arrows 21 and 23. The substrate may rotate, as indicated by arrow 61.

Reservoir 25 contains solution 27 drained from vessel 1 through drain 7 and conduit 29. Solution reservoir 25 may include at least one drain. The embodiment of the solution reservoir illustrated in FIG. 1 includes two drains 31 and 33. Drain 31 drains solution to be discarded, while drain 33 drains solution to be recycled back to vessel 1. The solution drained through drain 31 may be disposed through conduit 35. Solution drained through drain 33 may flow through conduit 37.

Solution flowing through conduit 37 may be pumped by pump 39. Pump 39 not only facilitates the draining of solution from solution reservoir 25 but facilitates the pumping of the solution toward vessel 1. Prior to reintroduction into a vessel 1, solution pumped by pump 39 may be directed through filter 41. The filter may be included to remove potential particulates that may be present in the reservoir.

A system according to the present invention may also include at least one sensor for sensing the composition of the solution and elements therein in the solution reservoir. For example, the system may include an oxygen sensor and/or a nitrogen sensor. The embodiment illustrated in FIG. 1 includes oxygen sensor 43 and nitrogen sensor 51.

The present invention may also include sensors for sensing material removed from the substrate and present in the solution as well as detecting acid levels in the solution. Along these lines, the present invention may include copper sensor 49.

The present invention may also include sources of oxygen and/or nitrogen for introducing oxygen and/or nitrogen into the solution while its in the solution reservoir 25. Along these lines, the embodiment of a system according to the present invention illustrated in FIG. 1 includes oxygen source 45 and nitrogen source 47.

In addition to introducing oxygen and/or nitrogen into the deplating solution while it is in the solution reservoir, the present invention may also include introducing deionized water into the solution. Along these lines, the embodiment of the system illustrated in FIG. 1 includes a source of deionized water 53.

As stated above, the present invention may include removing from the solution material removed from the substrate and present in the solution. As also stated above, the material may be electrochemically removed from the solution. Along these lines, the embodiment of the system illustrated in FIG. 1 includes electrodes for removing the material from the solution.

The system illustrated in FIG. 1 includes anode 55 and cathode 57. Anode 55 and cathode 57 may be connected to a power source and controller 59. Power source and controller may be connected electrodes 55 and 57 as well as to sensors 43, 49 and 51.

Power source and controller may also connected to oxygen and nitrogen sources 45 and 47, respectively, for controlling input of oxygen and nitrogen into the solution when it is in the solution reservoir 25. The power source and controller may also be connected to pump 39 for controlling flow of solution between the vessel and the reservoir.

While FIG. 1 illustrates separate vessel and reservoir, the apparatus may include a single container that all or some subset of functions are carried out in. Processes according to the present invention may take place by treating single substrates or a group of substrates as a batch. Therefore, the vessel and reservoir or single container may be much larger than the embodiment illustrated in FIG. 1.

While the present invention may add an extra step to semiconductor processing, such a step may save a great deal of time and money by eliminating other steps for cleaning and otherwise dealing with contamination due to deposits that have not been removed.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A system for removing material from a substrate, the system comprising:
    a vessel that receives the substrate in the form of a semiconductor wafer, the vessel also receives a solution that contacts and removes metal from a backside and edges of a semiconductor wafer;
    the solution received by the vessel comprising an aqueous solution comprising about 4% to about 30% of at least one acid and at least one surfactant;
    means for flowing a non-reactive fluid across a front side of said wafer thereby preventing contact of said solution with said front side of the semiconductor wafer;
    a cathode and an anode contacting the solution for removing from the solution material removed from the substrate; and
    a power source connected to the anode and the cathode.

2. A system for removing material from a substrate the apparatus comprising:
   a vessel for receiving the substrate and a solution for removing material from the substrate, the vessel including
      means for flowing a non-reactive fluid across a front side of said wafer thereby preventing contact of said solution with said front side of the semiconductor wafer;
      at least one drain in the vessel for draining the solution and at least one inlet for introducing the solution into the vessel;
   a solution reservoir including at least one inlet and at least one drain;
   connections permitting solution to flow between the vessel and the solution reservoir;
   a pump for pumping solution from the solution reservoir to the vessel;
   a cathode and an anode arranged in the solution reservoir for removing from the solution material removed from the substrate; and
   a power source connected to the anode and the cathode, said solution comprising about 4% to about 30% of at least one acid and at least one surfactant.

3. The system according to claim 2, wherein material removed from the substrate is on a first side and the apparatus further comprises:
   a source of deionized water directed at substrate in the vessel.

4. The system according to claim 2, further comprising:
   a filter for filtering the solution prior to flow into the vessel.

5. The system according to claim 2, wherein the vessel includes an inclined interior bottom surface.

6. The system according to claim 2, wherein the solution further comprises at least one complexing agent that complexes with the material removed from the substrate.

7. The system according to claim 2, further comprising:
   at least one sensor for sensing in the solution material removed from the substrate.

8. The system according to claim 2, further comprising:
   at least one sensor for sensing components of the solution.

9. The system according to claim 2, wherein the vessel includes a first drain for draining waste solution and a second drain connected to an inlet of the reservoir for permitting solution to flow from the vessel to the reservoir.

10. The system according to claim 2, further comprising:
    a source of deionized water for supplying deionized water to the reservoir.

11. The system according to claim 2, wherein the reservoir includes a first drain for draining waste solution and a second drain connected to an inlet of the reservoir for permitting solution to flow from the reservoir to the vessel, and wherein the pump pumps solution through the conduit.

12. The system according to claim 2, further comprising:
    a source of $O_2$ and a source of $N_2$ for introducing $O_2$ and $N_2$ into the reservoir; and
    an $O_2$ sensor for sensing $O_2$ in the solution in the reservoir.

13. The system according to claim 2, further comprising:
    a controller for controlling operation of the apparatus.

14. The system according to claim 2, wherein the solution removes metal from a semiconductor wafer to a level of about $1 \times 10^{10}$ atoms per square centimeter.

* * * * *